United States Patent
Gell et al.

(10) Patent No.: US 7,166,176 B2
(45) Date of Patent: Jan. 23, 2007

(54) CAST SINGLE CRYSTAL ALLOY COMPONENT WITH IMPROVED LOW ANGLE BOUNDARY TOLERANCE

(75) Inventors: Maurice Gell, Newington, CT (US); Allister William James, Orlando, FL (US)

(73) Assignee: Siemens Power Generation, Inc., Orlando, FL (US)

( * ) Notice: Subject to any disclaimer, the term of this patent is extended or adjusted under 35 U.S.C. 154(b) by 322 days.

(21) Appl. No.: 10/454,803

(22) Filed: Jun. 4, 2003

(65) Prior Publication Data

US 2004/0055669 A1    Mar. 25, 2004

Related U.S. Application Data

(60) Provisional application No. 60/391,721, filed on Jun. 26, 2002.

(51) Int. Cl.
*C22F 1/10* (2006.01)
(52) U.S. Cl. .................. 148/555; 148/426; 148/675
(58) Field of Classification Search ............... None
See application file for complete search history.

(56) References Cited

U.S. PATENT DOCUMENTS

| 4,643,782 | A |   | 2/1987 | Harris et al. |
| 4,935,072 | A | * | 6/1990 | Nguyen-Dinh ............ 148/562 |
| 5,154,884 | A |   | 10/1992 | Wukusick et al. |
| 6,051,083 | A | * | 4/2000 | Tamaki et al. ............ 148/410 |
| 2002/0062886 | A1 | * | 5/2002 | Hino et al. ............ 148/562 |

OTHER PUBLICATIONS

Harris, Ken; Wahl, Jacqueline B. CMSX® -486, A New Grain Boundary Strengthened Single Crystal Supealloy. Turbo Expo 2002, Jun. 3-6, 2002, Amsterdam, The Netherlands.

* cited by examiner

*Primary Examiner*—John P. Sheehan

(57) ABSTRACT

A nickel-based single crystal gas turbine component (30) having a low angle boundary (34) with improved material properties resulting from retained gamma/gamma prime eutectic phase at the low angle boundary. The coarse eutectic phase nodules roughen the grain boundary, reduce the slip distance and disperse concentrated planar slip in the vicinity of the boundary. As a result, the allowable angle of misorientation at the boundary may be increased to greater than 6° for the most highly stressed or critical areas of the component, thereby reducing the amount of scrap material and lowering the cost of manufacturing of a single crystal gas turbine component.

17 Claims, 3 Drawing Sheets

CAST SINGLE CRYSTAL ALLOY COMPONENT WITH IMPROVED LOW ANGLE BOUNDARY TOLERANCE

This application claims benefit of the Jun. 26, 2002, filing date of U.S. provisional application No. 60/391,721.

FIELD OF THE INVENTION

This invention relates generally to the field of metallurgy, and more specifically to a single crystal superalloy having improved low angle boundary tolerance, and in particular to a component for a gas turbine engine formed of such a superalloy material.

BACKGROUND OF THE INVENTION

Nickel and cobalt based superalloy materials have been developed for high stress, high temperature, corrosive environment applications such as gas turbine engine components. These materials have permitted engine designers to substantially increase the firing temperatures for modern gas turbine engines, thereby improving the power output and efficiency of the engines. The drive for higher power output, improved efficiency and reduced emissions continues to drive the development of materials that exhibit improved mechanical properties and corrosion resistance under increasingly harsh conditions.

It is known that materials used at high temperatures tend to fail along grain boundaries. Efforts have been made to improve the performance of alloy materials by reducing or eliminating grain boundaries. One approach is to preferentially orient all grain boundaries in the direction of the principal stress axis by providing a columnar-grained structure. Such materials exhibit improved mechanical properties along the principal stress axis, however, limiting strength and ductility properties still exist in the transverse direction due to the presence of the columnar grain boundaries. It is also known to add grain boundary strengthening elements such as carbon, boron, hafnium or zirconium to an alloy in order to increase the strength along the grain boundaries. However, these elements have a further effect of reducing the melting temperature of the material, which may limit the available temperature window for solution heat treatment and may restrict the use of the material to lower temperature applications.

Single crystal casting techniques have been developed to produce articles without grain boundaries. Conventional nickel-based superalloy materials may be cast to form single crystal components, and special alloys have also been developed to more fully exploit the advantages of the single crystal structure and to overcome certain limitations of the conventional materials. U.S. Pat. Nos. 4,643,782 and 5,154,884 describe examples of such materials.

Nickel-based superalloys include a plurality of chemically and physically distinct phases. A major phase known as the gamma phase or the gamma matrix forms the matrix of the alloy. A major precipitate phase within the gamma matrix is referred to as the gamma prime precipitate. Carbides and borides also precipitate in the gamma matrix. The high temperature strength of the alloy will depend upon the amount of the gamma prime precipitate, carbides and borides in the matrix. Because the carbides and borides tend to reduce the melting temperature of the alloy, it is generally desired to maximize the amount of gamma prime precipitate in order to maximize the strength of the alloy. Gamma prime may take the form of either a fine grain gamma prime precipitate or a course grain gamma/gamma prime eutectic, depending upon the temperature history of the material. An as-cast material will contain a significant portion of the gamma prime as gamma/gamma prime eutectic. Because the phases in the gamma/gamma prime eutectic are coarse, they do not confer strength to the superalloy. During a homogenization solution heat treatment step, the coarse gamma/gamma prime eutectic is taken into solution and re-precipitated as fine gamma prime upon cooling from the solution heat treatment temperature. The fine gamma prime does contribute to the overall strength of the superalloy.

A pure single crystal structure may be formed in a laboratory environment, but real world component castings may result in the nucleation of more than one single grain during any casting process. Any misorientation between neighboring grains results in a low angle boundary (LAB) within the material. Low angle boundaries between adjacent single crystal grains may be visible to the naked eye in the as-cast condition or on an acid-etched surface. Such boundaries are generally undesirable because they are weaker than the bulk single crystal material. A low angle boundary is often the location of failure of a single crystal component. The higher the angle of misorientation of the LAB, the lower the strength will be across the boundary. Accordingly, single crystal component and material specifications for gas turbine engines generally call for the use of materials that contain low angle boundaries of no more than 6 degrees for the most highly stressed and most critical components, and no more than 12 degrees for somewhat lower stressed components. For instance, gas turbine vendors make it a practice to identify zones of the gas turbine blades that have particular quality acceptance standards. The most highly stressed and/or most critical zones, for example a mid-span region exposed to the highest thermal strains, require single crystal materials having a low angle boundary of 6 degrees or less. Other less highly stressed areas or areas exposed to lower temperatures require single crystal materials having a low angle boundary of 12 degrees or less. Such requirements result in the scrapping of a significant amount of cast material, thereby increasing the overall cost of manufacturing a single crystal component.

SUMMARY OF THE INVENTION

Accordingly, an improved single crystal material is needed to reduce the sensitivity of the material properties to the presence of low angle boundaries. Further, a method of forming a single crystal gas turbine component is needed that reduces the rate of rejection of materials due to low angle boundaries being in excess of a predetermined limit.

A component for use in an elevated temperature environment is described herein as including: a nickel-based single crystal superalloy material cast to a predetermined shape and comprising a low angle boundary between adjacent single crystal grains of the material; and a plurality of nodules of the gamma/gamma prime eutectic phase of the material disposed along the low angle boundary in a quantity sufficient to influence a mechanical property across the boundary.

A method of making a cast single crystal component is described herein as including; casting a nickel-based superalloy material to a predetermined shape having a low angle boundary between adjacent dendrites of the material, the cast material comprising a plurality of nodules of the gamma/gamma prime eutectic phase along the boundary; and selecting a solution heat treatment regiment for the cast material to retain a sufficient quantity of the nodules of the gamma/gamma prime eutectic phase along the boundary to influence a mechanical property across the boundary during operation of the component. An allowable angle of misorientation of the low angle boundary may be specified considering an improvement of the mechanical property due to the presence of the eutectic phase along the boundary, and it may be specified to be greater than 6 degrees for the most highly stressed region or greater than 12 degrees for a less highly stressed region.

A manufacturing process for a cast nickel-based single crystal superalloy component for a gas turbine engine is described as including the improvement of increasing an allowable angle of misorientation for a low angle boundary in the cast nickel-based single crystal superalloy material to account for a mechanical property improvement across the low angle boundary resulting from a plurality of nodules of a gamma/gamma prime eutectic phase of the material selectively retained along the low angle boundary.

A cast single crystal superalloy component for a gas turbine engine having a plurality of zones having respective quality acceptance standards is described herein as including the improvement of: a selective amount of the gamma/gamma prime eutectic phase of the superalloy material retained along a low angle boundary between adjacent grains of the superalloy; and a most highly stressed zone of the component having a low angle boundary angle of misorientation acceptance standard of greater than 6 degrees.

BRIEF DESCRIPTION OF THE DRAWINGS

These and other advantages of the invention will be more apparent from the following description in view of the drawings that show.

DETAILED DESCRIPTION OF THE INVENTION

Figure 1:
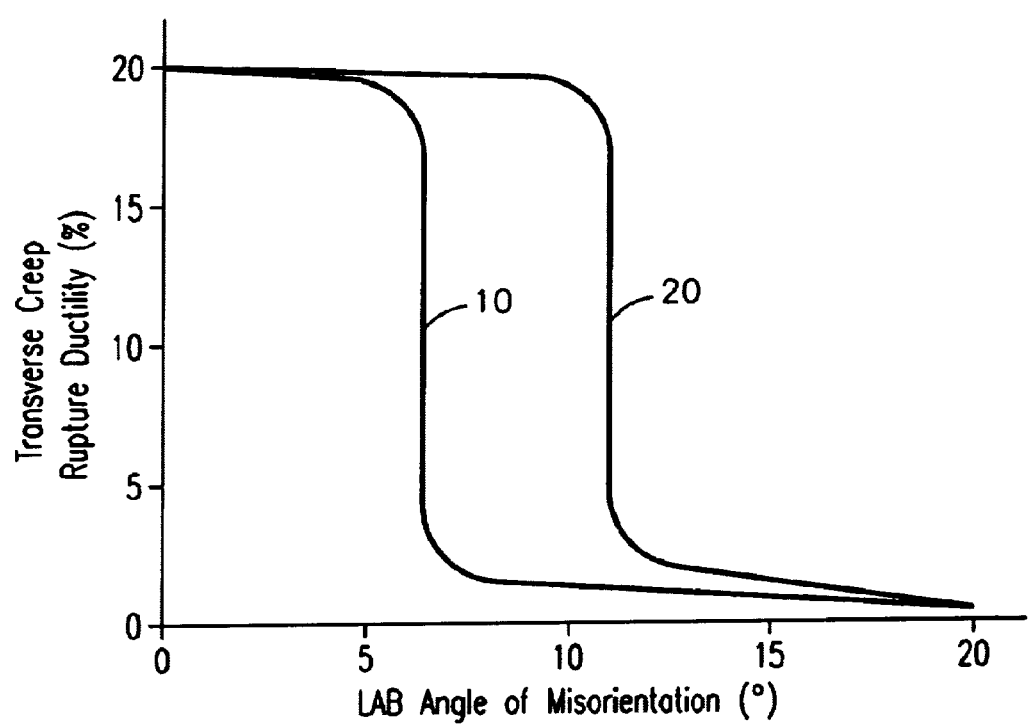
FIG. 1 is a graph of transverse creep rupture ductility verses LAB angle of misorientation showing both a prior art material and a material formed to retain the gamma/gamma prime eutectic phase at the low angle boundary.

It is known that a single crystal nickel-based superalloy material will exhibit a degradation of mechanical properties as the angle of misorientation increases at a low angle boundary within the material. Curve 10 of FIG. 1 illustrates the affect of a low angle boundary on the mechanical properties of an exemplary prior art nickel-based single crystal material. The vertical axis of FIG. 1 is representative of a variety of mechanical properties, the most sensitive of which is elevated temperature transverse ductility. In the absence of a low angle boundary, i.e. at zero on the horizontal axis of FIG. 1, the transverse creep rupture ductility is about 20%. The ductility degrades gradually as the angle of misorientation increases to about 6%, whereat the ductility has a value of about 18%. Further increases in the angle of misorientation have a markedly increased effect upon the ductility. At about 10% misorientation, the exemplary prior art material exhibits only about 0.5% ductility.

The generally accepted prior art practice is to re-solution the gamma/gamma prime eutectic in a nickel-based superalloy in order to improve the strength of the alloy. This is accomplished during the solution heat treatment performed after casting to homogenize the microstructure. Solution heat treatment at temperatures above the gamma prime solvus temperature takes the strengthening gamma prime phase into solution. Controlled cooling from the solution heat treatment temperature re-precipitates the gamma prime at a size, shape and distribution that improve the mechanical properties. Thus, the solution heat treatment is used to significantly reduce the amount of gamma/gamma prime eutectic phase, and to re-precipitate the gamma prime in a morphology beneficial to the mechanical properties. The improvement in mechanical properties between the as-cast and the solution heat treated condition, expressed in terms of temperature, may be approximately 15° C. (25° F.)

Figure 2:
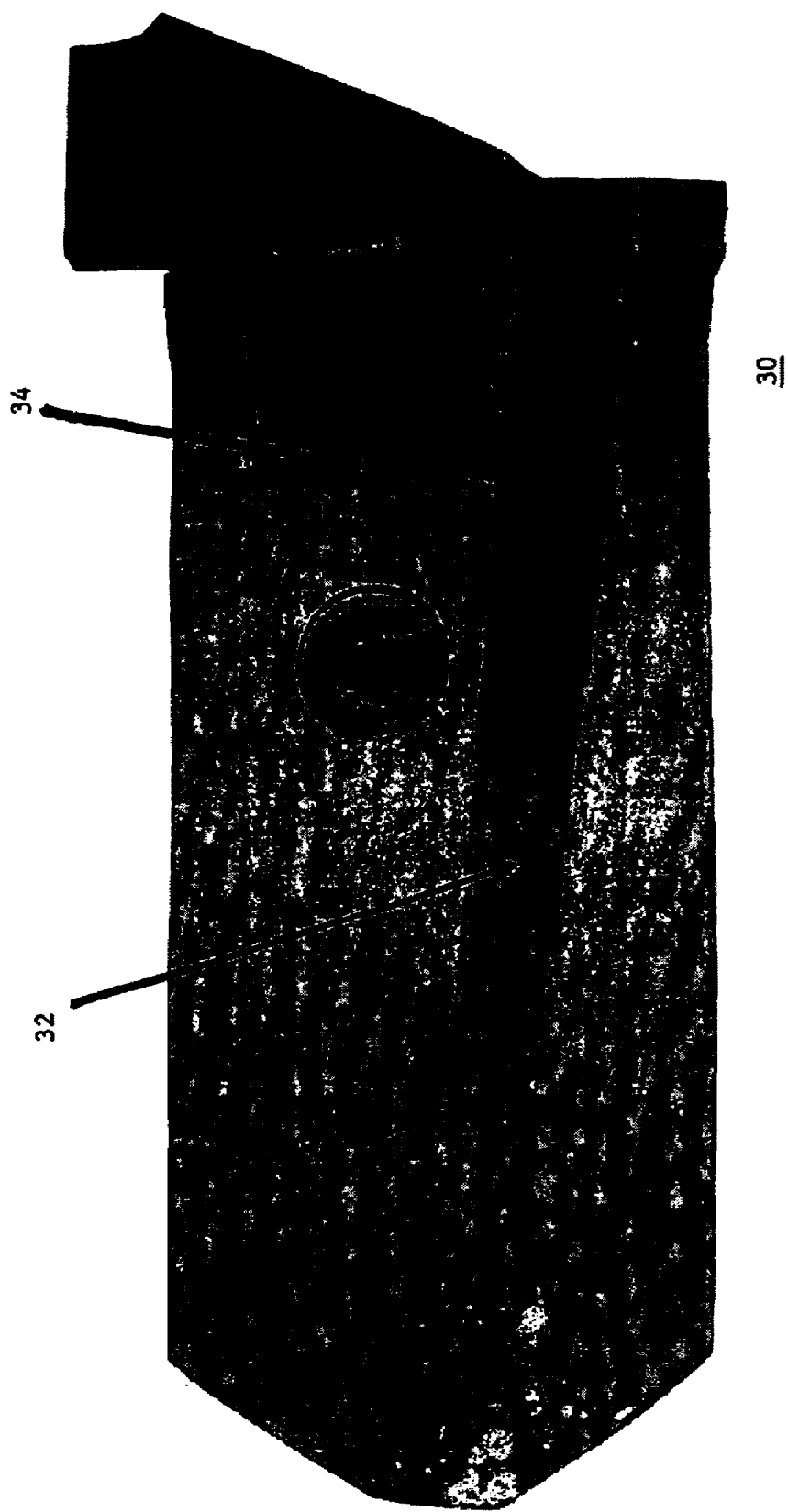
FIG. 2 is a photograph of a single crystal component exhibiting a low angle boundary that is strengthened by the gamma/gamma prime eutectic phase.
Figure 3:
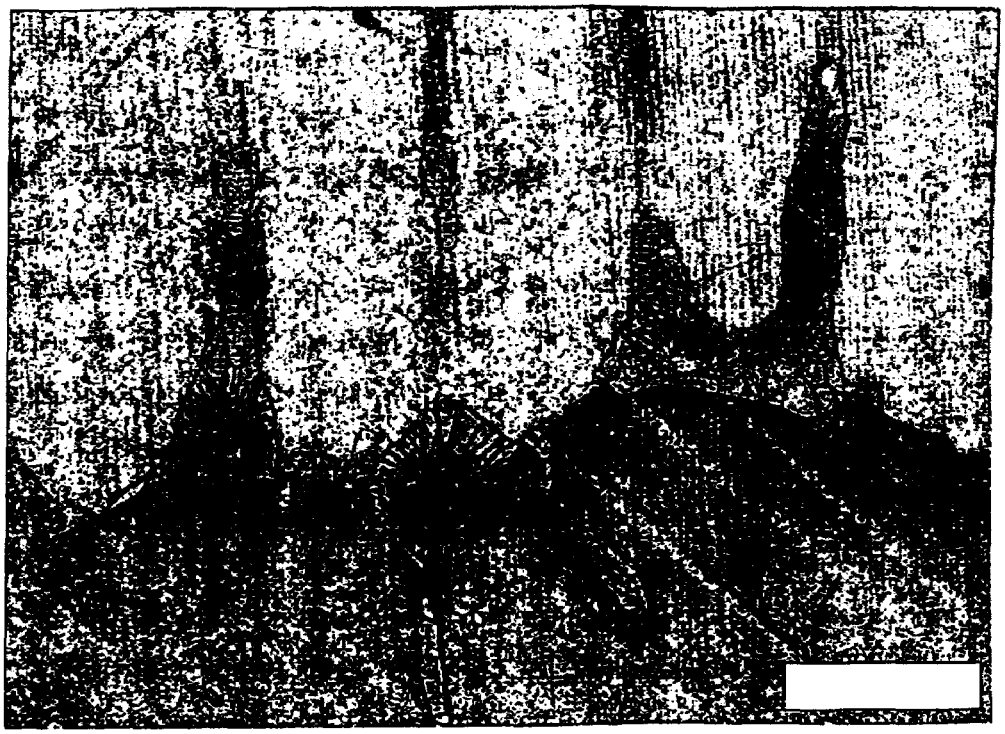
FIG. 3 is a photograph of a low angle boundary that is improved by the selective retention of gamma/gamma prime eutectic phase at the boundary.
Figure 4:
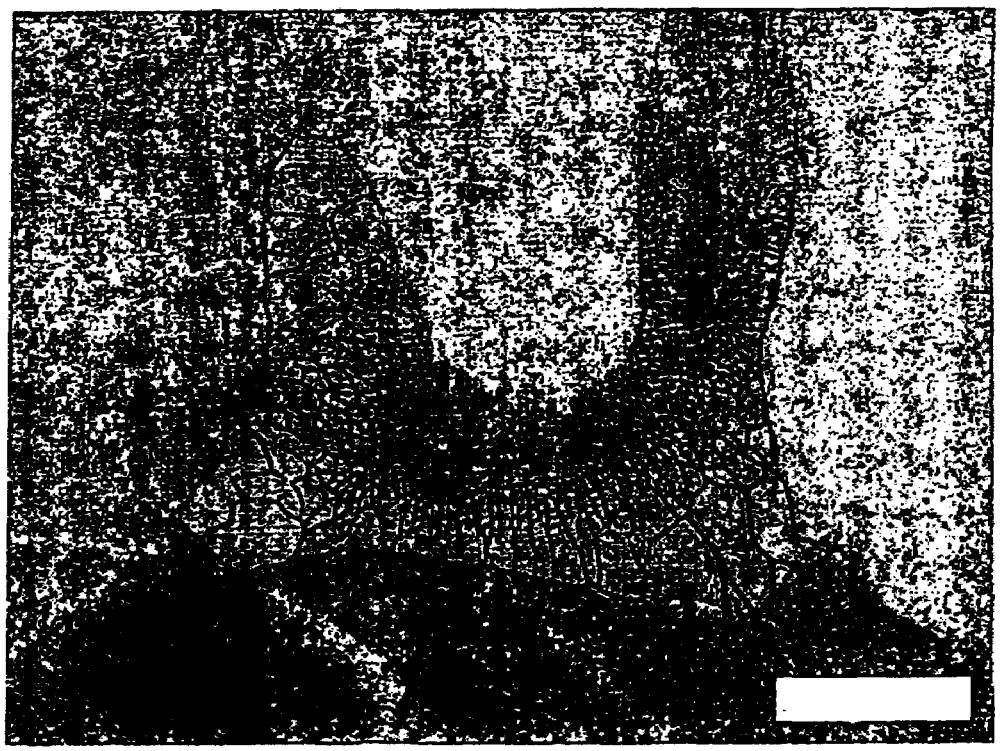
FIG. 4 is the material of FIG. 3 as seen at a higher magnification.

It has been discovered that the selective retention of a plurality of coarse nodules of the gamma/gamma prime eutectic phase of the superalloy material along the LAB interface will result in an improvement of the mechanical properties of the material at LAB angles of misorientation that are generally higher than those previously deemed acceptable for use in gas turbine components. This improvement may be translated into a relaxation of the LAB misorientation specification for a single crystal gas turbine component. Curve 20 of FIG. 1 illustrates the predicted effect of a low angle boundary on the mechanical properties of a nickel-based single crystal material formed to retain the gamma/gamma prime eutectic along the low angle boundary in accordance with this invention. The nodules of the gamma/gamma prime eutectic phase will preferentially precipitate along the grain boundary, as shown in FIGS. 3 and 4, and the presence of the eutectic phase roughens the boundary, reduces the slip distance and disperses concentrated planar slip in the vicinity of the boundary. FIG. 3 is a micrograph picture of one embodiment of a low angle boundary of material formed in accordance with the present invention, and FIG. 4 is the same boundary at a higher level of magnification. As illustrated in FIG. 2, the ductility at angles of misorientation from zero to about 6 degrees are very close to that of the prior art material. Curve 20 shows that the ductility continues its gradual decrease to about 18% at a misorientation of about 12 degrees. Thus, the ductility of the improved material is significantly higher than that of the prior art material in the range of 6–12 degrees misorientation. For example, when the low angle boundary angle of misorientation is between 6 and 12 degrees, the ductility of the nickel-based single crystal superalloy material remains greater than 5%. Comparing the ductility values of curves 10 and 20 at various degrees of misorientation between about 6 degrees and 12 degrees, it may be appreciated that the nodules retained at the low angle boundary increase a mechanical property of the material across the low angle boundary by at least 10%, or by at least 20%, or by at least 40% when compared to a similar material not having such nodules present at the boundary. Real-world castings are often formed with angles of misorientation that exceed 6 degrees, and at such higher angles of misorientation, the presence of eutectic at the boundary provides an improvement in the material performance. Thus, a highly stressed or critical component formed in accordance with the present invention may be acceptable with LAB misorientation of greater than 6 degrees and up to about 12 degrees, whereas with the prior art material such component would require no more than 6 degrees misorientation.

FIG. 2 is a photograph of a single crystal component 30 having a secondary grain 32 with the low angle boundary 34 being clearly visible. The component 30 may be shaped to be a vane, blade or other hot gas path component of a gas turbine engine. The mechanical properties of the LAB of this component 30 are improved by the retention of a controlled amount of the coarse gamma/gamma prime eutectic phase created at the boundary 34 during the casting process. It is believed that the amount of eutectic phase at the grain boundary can be varied by a solution heat treatment selection that promotes eutectic formation, perhaps with minor compositional changes within the compositional range of existing single crystal alloy specifications. The beneficial effect may be accomplished both with the normal additions of such grain boundary strengthening elements such as carbon, boron, hafnium or zirconium that exist in current master heat formulations as well as with formulations where there are no special additions of such elements. In one embodiment, carbon, boron, hafnium and zirconium exist at no more than trace amounts. Accordingly, for embodiments where the angle of misorientation is greater than 6 degrees, the component 30 of FIG. 2 may be acceptable for use where a similar prior art component lacking such a controlled amount of eutectic at the LAB would be scrapped. This improvement may be achieved by using a partial or modified solution heat treatment or by omitting a solution heat treatment. Thus casting yields may be improved while minimizing the reduction in high temperature properties that are typically associated with adding grain boundary strengthening elements.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A component for use in an elevated temperature environment, the component comprising:
   a nickel-based single crystal superalloy material cast to a predetermined shape and comprising a low angle boundary between adjacent single crystal grains of the material; and
   a plurality of nodules of a gamma/gamma prime eutectic phase of the material selectively retained along the low angle boundary following a partial solution heat treatment process in a quantity sufficient to influence a mechanical property across the boundary.

2. The component of claim 1, wherein the predetermined shape comprises an airfoil component for a gas turbine engine and the low angle boundary has an angle of misorientation of greater than 6 degrees.

3. The component of claim 1, wherein the low angle boundary angle of misorientation is between 6 and 12 degrees and the ductility of the nickel-based single crystal superalloy material is greater than 5%.

4. The component of claim 1, wherein the nodules increase a mechanical property of the material across the low angle boundary by at least 10% when compared to a similar material not having such nodules present at the boundary.

5. The component of claim 1, wherein the nodules increase the mechanical property of the material across the low angle boundary by at least 20% when compared to a similar material not having such nodules present at the boundary.

6. The component of claim 1, wherein the nodules increase the mechanical property of the material across the low angle boundary by at least 40% when compared to a similar material not having such nodules present at the boundary.

7. The component of claim 1 shaped to be a component of a gas turbine engine.

8. The component of claim 1, wherein the superalloy material comprises each of the group of carbon, boron, hafnium and zirconium at no more than trace amounts.

9. A method of making a cast single crystal component, the method comprising;
   casting a nickel-based superalloy material to a predetermined shape having a low angle boundary between adjacent single crystal grains of the material, the cast material comprising a plurality of nodules of a gamma/gamma prime eutectic phase of the superalloy material along the boundary; and
   selecting a solution heat treatment regiment less than a full solution heat treatment for the cast material to retain a sufficient quantity of the nodules of the gamma/gamma prime eutectic phase along the boundary to influence a mechanical property across the boundary during operation of the component.

10. The method of claim 9, further comprising specifying an allowable angle of misorientation of the low angle boundary considering an improvement of the mechanical property due to the presence of the retained eutectic phase along the boundary.

11. The method of claim 9, further comprising specifying a maximum allowable angle of misorientation of the low angle boundary to be greater than 6 degrees.

12. The method of claim 9, further comprising specifying a maximum allowable angle of misorientation of the low angle boundary to be greater than 6 degrees for a most highly stressed component of a gas turbine engine.

13. The method of claim 9, further comprising:
   casting the predetermined shape to be a blade for a gas turbine engine; and
   specifying an allowable angle of misorientation of the low angle boundary to be greater than 6 degrees for a mid-span portion of the blade.

14. The method of claim 9, further comprising selecting the nickel-based superalloy material to comprise each of the group of carbon, boron, hafnium and zirconium at no more than trace amounts.

15. In a manufacturing process for a cast nickel-based single crystal superalloy component for a gas turbine engine, the improvement comprising increasing an allowable angle of misorientation for a law angle boundary between adjacent grains of the material in the cast nickel-based single crystal superalloy material to account for a mechanical property improvement across the low angle boundary resulting from a plurality of nodules of a gamma/gamma prime eutectic phase of the superalloy material selectively retained along the low angle boundary as a result of performing a partial solution heat treatment after casting.

16. The method of claim 15, further comprising increasing the allowable angle to greater than 6 degrees for a critical portion of the component.

17. A cast single crystal superalloy component for a gas turbine engine having a plurality of zones having respective quality acceptance standards, the improvement comprising:

a selective amount of the gamma/gamma prime eutectic phase of the superalloy material retained from an as-cast condition of the material along a low angle boundary between adjacent grains of the superalloy as a result of the material being subjected to only a partial solution heat treatment; and a most highly stressed zone of the component having a low angle boundary angle of misorientation acceptance standard of greater than 6 degrees.

* * * * *